United States Patent
Nara et al.

(12) 
(10) Patent No.: US 6,504,983 B1
(45) Date of Patent: Jan. 7, 2003

(54) OPTICAL WAVEGUIDE AND METHOD FOR FABRICATING THE SAME

(75) Inventors: Kazutaka Nara, Chiyoda-ku (JP); Kazuhisa Kashihara, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 102 days.

(21) Appl. No.: 09/820,800

(22) Filed: Mar. 30, 2001

(30) Foreign Application Priority Data

Mar. 30, 2000 (JP) ........................................ 2000-094026

(51) Int. Cl.$^7$ ........................... G02B 6/10; C03B 37/022
(52) U.S. Cl. ........................ 385/132; 385/129; 385/131; 65/386; 65/17.4; 65/413
(58) Field of Search ........................... 65/377, 385, 386, 65/17.1, 17.4, 30.1, 30.12, 413; 385/129–132

(56) References Cited

U.S. PATENT DOCUMENTS

| | | | |
|---|---|---|---|
| 4,946,251 A | * | 8/1990 | Ashwell et al. |
| 5,551,966 A | * | 9/1996 | Hirose et al. .................. 65/377 |
| 5,556,442 A | * | 9/1996 | Kanamori et al. ........... 65/17.4 |
| 2002/0118942 A1 | * | 8/2002 | Makikawa .................. 385/129 |

FOREIGN PATENT DOCUMENTS

| | | |
|---|---|---|
| JP | 61-039645 | 9/1986 |
| JP | 63-182227 | 7/1988 |
| JP | 63-239134 | 10/1988 |

* cited by examiner

Primary Examiner—Hemang Sanghavi
(74) Attorney, Agent, or Firm—Oblon, Spivak, McClelland, Maier & Neustadt, P.C.

(57) ABSTRACT

The crosstalk characteristics of an arrayed waveguide grating or the like are improved. One or more of substrates are placed at a circumferential position centering the table rotational center C on a turntable that rotates at a constant angular speed of rotation ω and the turntable is rotated. A burner is moved to and fro in the radial direction of the turntable between positions $r_1$ and $r_2$ in the radial direction of the turntable and is reciprocated across the substrates. A material gas of glass, an oxygen gas and a hydrogen gas are passed through the burner to generate a hydrolysis reaction of the material gas in a hydrogen oxygen flame and an under cladding glass particle, a core glass particle and an over cladding particle are sequentially deposited on the substrates to form an optical waveguide part. The rotation velocity $r_1\omega$ of the turntable at the position $r_1$ is set 600 mm/sec or above at least in the step of depositing the core glass particle among the steps of depositing the under cladding glass particle, the core glass particle and the over cladding particle.

3 Claims, 7 Drawing Sheets

… (n is an integer of two or greater) are inputted from one
input optical waveguide 12, these lights are diffracted at the
OPTICAL WAVEGUIDE AND METHOD FOR FABRICATING THE SAME

BACKGROUND OF THE INVENTION

Recently, in the optical communications, research and development of the optical wavelength division multiplexing communications have been well-practiced for the way to dramatically increase the transmission capacity thereof and practical applications have been proceeding. The optical wavelength division multiplexing communications are in which a plurality of lights having a wavelength different each other is wavelength-multiplexed and is transmitted, for example. In such an optical wavelength division multiplexing communications system, an optical multi/demultiplexer is needed which separates a plurality of lights having a wavelength different each other from the wavelength multiplexed lights to be transmitted or combines a plurality of lights having a wavelength different each other.

Figure 4:
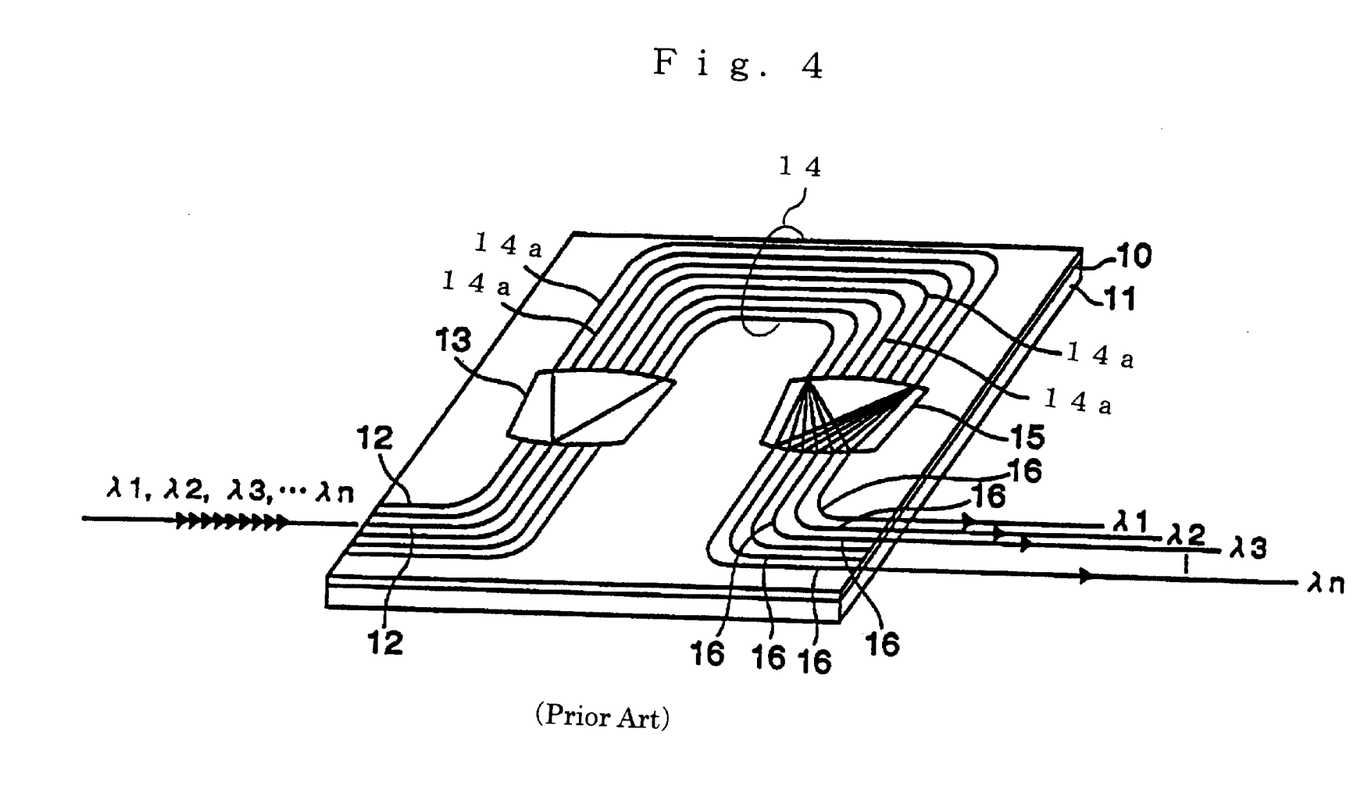
FIG. 4 depicts an illustration showing a configuration of an ordinary arrayed waveguide grating along with a wavelength demultiplexing operation thereof.

One example of this kind of optical multi/demultiplexer is an Arrayed Waveguide Grating (AWG). The arrayed waveguide grating is that an optical waveguide part 10 having waveguides as shown in FIG. 4 is formed on a substrate 11, for example.

The waveguides are formed of one or more of input optical waveguides 12 arranged in parallel; a first slab waveguide 13 connected to the output side thereof; an arrayed waveguide 14 made of a plurality of channel waveguides 14a arranged in parallel, the channel waveguides being connected to the output side of the first slab waveguide 13; a second slab waveguide 15 connected to the output side of the arrayed waveguide 14; and a plurality of output optical waveguides 16 arranged in parallel, the output optical waveguides being connected to the output side of the second slab waveguide 15.

The channel waveguides 14a are a set for propagating lights that have been lead through the first slab waveguide 13 and are formed in length having a different setting each other. Number of the channel waveguides 14a constituting the arrayed waveguide 14 are generally disposed in multiple such as a hundred. However, in FIG. 4, to simplify the drawing, the number of these respective waveguides 12, 14a and 16 is schematically depicted.

To the input optical waveguides 12, optical fibers on the transmitting side are connected, for example, and wavelength multiplexed lights are lead. The lights that have been lead to the first slab waveguide 13 through the input optical waveguides 12 are expanded by the diffraction effects thereof to enter each of the plurality of channel waveguides 14a, propagating through the arrayed waveguide 14.

The lights that have propagated through the arrayed waveguide 14 reach the second slab waveguide 15 and are condensed at the output optical waveguides 16 to be outputted. At this time, the length of each of the channel waveguides 14a varies each other in a setting amount. Thus, a shift is generated in the phase of the respective lights after propagating through each of the channel waveguides 14a, a phase front of the condensed lights is tilted according to this shifted amount and the positions at which the lights are focused are determined by this tilted angle. Therefore, the positions at which the lights having a different wavelength are focused differ from each other, the output optical waveguides 16 are formed on each of the position at which the lights are focused and thereby the lights having a different wavelength can be outputted from the different optical waveguides 16 at every wavelength.

For example, as shown in FIG. 4, when wavelength multiplexed lights having wavelengths λ1, λ2, λ3, . . . and λn (n is an integer of two or greater) are inputted from one input optical waveguide 12, these lights are diffracted at the first slab waveguide 13. Then, they reach the arrayed waveuide 14, pass through the second slab waveguide 15, as set forth, are focused at different positions according to wavelengths and enter the output optical waveguides 16 different from each other. Signal lights pass through the separate output optical waveguides 16 and are outputted from the end of the output optical waveguides 16. An optical fiber for outputting light is connected to the end of each of the output optical waveguides 16 and thereby each of the lights having a wavelength is separated and derived.

In this arrayed waveguide grating, improvement of the wavelength resolution of the diffraction grating is in proportion to a difference in length (ΔL) of each of the channel waveguides 14a that constitute the diffraction grating. On this account, the ΔL is designed large and thereby optically multiplexing/demultiplexing wavelength multiplexed lights having a narrow wavelength spacing is made possible, which could not be realized by a normally diffraction grating. Therefore, the function of multiplexing/demultiplexing a plurality of signal lights, that is, the function of multiplexing or demultiplexing a plurality of light signals having a wavelength spacing of 1 nm or under can be served, the function is required to realize the highly dens optical wavelength division multiplexing communications.

SUMMARY OF THE INVENTION

One viewpoint of the present invention is to provide a method for fabricating an optical waveguide. The method for fabricating the optical waveguide comprises:

placing one or more of substrates at a circumferential position on a turntable remote from a rotational center position in the radial direction;

rotating the turntable at a constant angular velocity of rotation ω in this substrate position;

moving a burner to and fro in the radial direction of the turntable between a position $r_1$ in the radial direction of the turntable rotating and a position $r_2$ on the side inner than the position r1 to reciprocate the burner across the substrates;

passing a material gas of glass, an oxygen gas and a hydrogen gas through the burner to generate a hydrolysis reaction of the material gas in a hydrogen oxygen flame; and sequentially depositing an under cladding glass particle, a core glass particle and an over cladding particle on the substrates to form an optical waveguide part, wherein a turntable rotation speed $r_1\omega$ im at the position $r_1$ is set 600 mm/sec or above at least in the step of depositing the core glass particle in the steps of depositing the under cladding glass particle, the core glass particle and the over cladding glass particle.

Additionally, another viewpoint of the invention is to provide an optical waveguide and this optical waveguide is characterized in that the optical waveguide is fabricated by the method for fabricating the optical waveguide set forth.

BRIEF DESCRIPTION OF THE DRAWINGS

Exemplify embodiments of the invention will now be described in conjunction with drawings in which.

DETAILED DESCRIPTION

An ordinary arrayed waveguide grating as shown in FIG. 4 described above has an optical waveguide part 10 having an under cladding formed of a silica-based glass, a core on the upper side thereof and an over cladding embedding this core. This optical waveguide part 10 is formed on a substrate 11 such as a silicon. An optical waveguide having this optical waveguide part 10 is fabricated by a fabricating method using a flame hydrolysis deposition method as follows, for example.

Figure 1A:
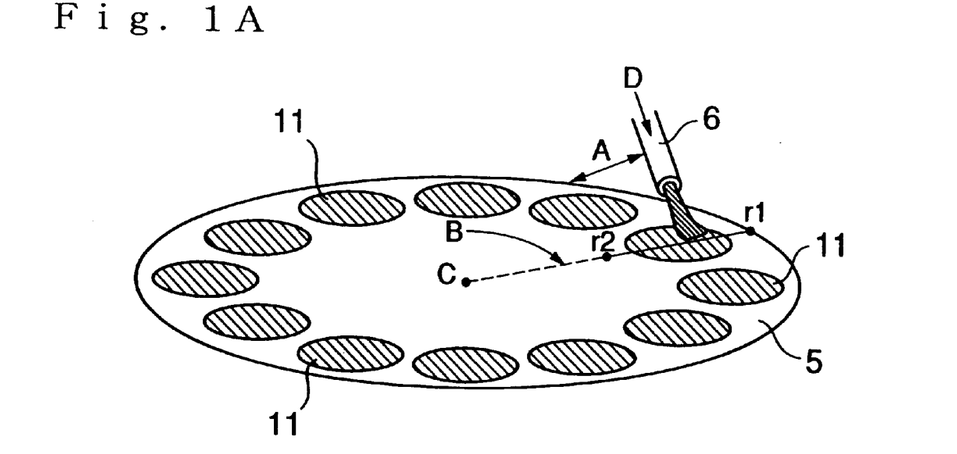
FIGS. 1A to 1E depict illustrations of a method for fabricating a optical waveguide.

That is, as shown in FIG. 1A, one or more of substrates 11 are placed at a circumferential position centering the table rotational center C on a turntable 5 that rotates at a constant angular velocity of rotation ω.

Then, the turntable 5 is rotated in the direction B, for example. Subsequently, as shown by an arrow A, a burner 6 is moved to and fro in the radial direction between a position $r_1$ in the radial direction of the turntable 5 and a position $r_2$ on the side inner than the position $r_1$ and is reciprocated across the substrates 11. Then, as shown by an arrow D, a material gas of glass, an oxygen gas and a hydrogen gas are passed through the burner 6 to generate a hydrolysis reaction of the material gas in a hydrogen oxygen flame and an under cladding glass particle and a core glass particle are deposited on the substrates 11 sequentially. After that, they are consolidated, a core is patterned by photolithography and a reactive ion etching method and then an over cladding particle is deposited on the core pattern to form the optical waveguide part 10.

Conventionally, the angular velocity of rotation ω of the turntable 5 has been set 9.0 rpm when depositing the under cladding glass particle, the core glass particle and the over cladding particle.

Figure 1B:
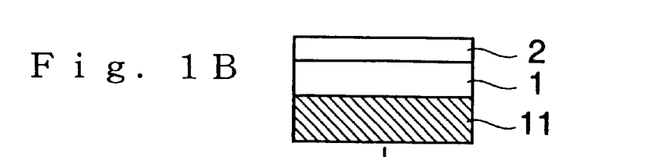

Additionally, by the deposition of the under cladding glass particle, the core glass particle and the over cladding particle as set forth, an under cladding 1, a core 2 and an over cladding 3 are formed as shown in FIGS. 1B to 1E. Hereafter, the steps of FIGS. 1B to 1E will be described specifically. The step shown in FIG. 1B is the step of depositing glass particles of the under cladding 1 and the core 2.

First, a source halogen gas mixed with $SiCl_4$, $BCl_3$ and $PCl_3$ as a material gas of the cladding glass as set forth is passed through the burner 6 along with the oxygen gas and the hydrogen gas. The hydrolysis reaction of the material gas is generated in the hydrogen oxygen flame and the glass particle of the under cladding 1 (under cladding glass particle) is deposited on the substrate 11.

Then, a source halogen gas mixed with $SiCl_4$, $BCl_3$, $PCl_3$ and $GeCl_4$ as a material gas of the core glass is passed through the burner 6 along with the oxygen gas and the hydrogen gas. The hydrolysis reaction of the material gas is generated in the hydrogen oxygen flame and the glass particle of the core 2 (core glass particle) is deposited.

Figure 1C:
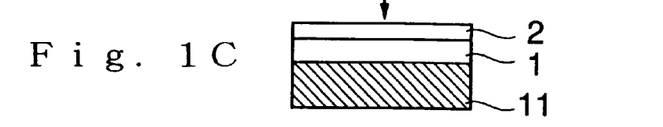

The step shown in FIG. 1C is the step of clearing glass particle films of the under cladding 1 and the core 2. In this step, the under cladding and core glass particles that have been deposited are heat-treated at a temperature of 1300□C. or above to clear the glass particle films of the under cladding 1 and the core 2.

Figure 1D:
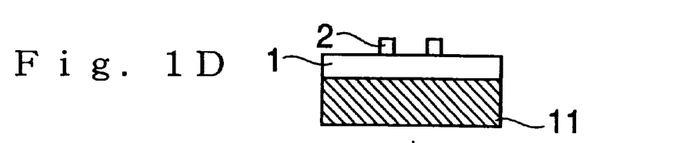

Subsequently, as shown in FIG. 1D, an optical waveguide pattern of an arrayed waveguide grating is formed on the core 2 by photolithography and a reactive ion etching method to form the core 2 having the optical waveguide configuration.

Figure 1E:
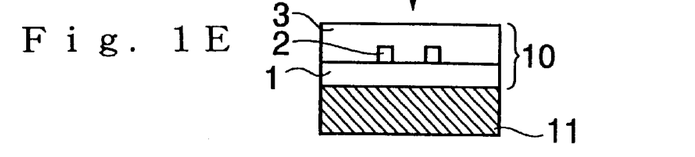

After that, as shown in FIG. 1E, a film of the over cladding 3 is formed on the upper side of the core 2 so as to cover the core 2. Furthermore, the same as when forming the under cladding 1, the film of the over cladding 3 is formed by generating the hydrolysis reaction of the source gas of the cladding glass in the hydrogen oxygen flame, depositing a glass particle of the over cladding 3 (over cladding glass particle) and consolidating this over cladding glass particle at a temperature of 1200° C., for example.

However, an optical multi/demultiplexer as the arrayed waveguide grating set forth is required to have a low crosstalk between adjacent transmission wavelengths.

Figure 5:
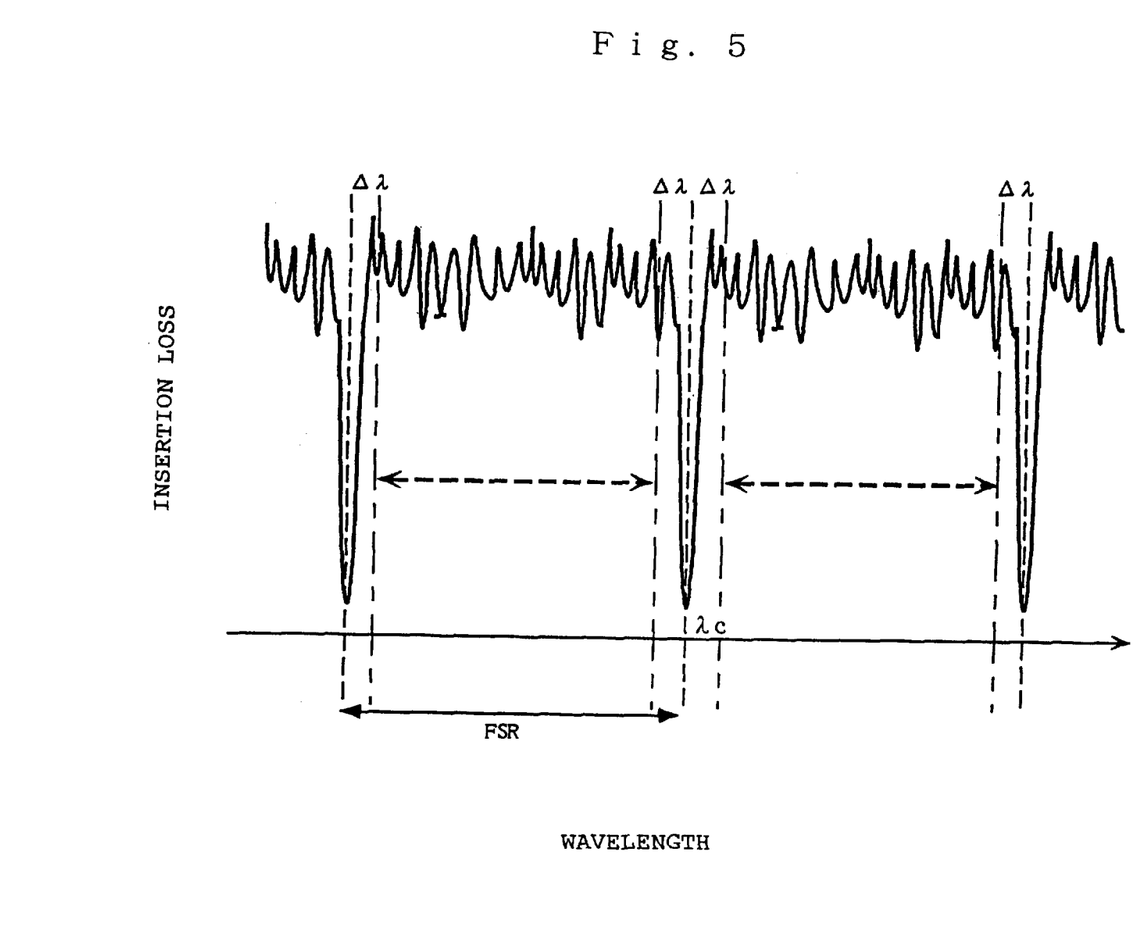
FIG. 5 depicts an illustration showing a definition of the background crosstalk.

Specifically, a worst loss in a wavelength bandwidth where it becomes $\lambda c-FSR+\Delta\lambda<\lambda<\lambda c-\Delta\lambda$ or $\lambda c+\Delta\lambda<\lambda<\lambda c+FSR-\Delta\lambda$ is defined as a background crosstalk; where a channel spacing is $\Delta\lambda$, a center wavelength is $\lambda c$, a Free Spectral Range is FSR as shown in FIG. 5. It is demanded that this background crosstalk should be approximately 28 to 29 dB at lowest as the performance of the optical multi/demultiplexer applied to a wavelength division multiplexing transmission system. When the background crosstalk is degraded, a Bit error rate in the wavelength division multiplexing transmission systems becomes great.

Figure 8:
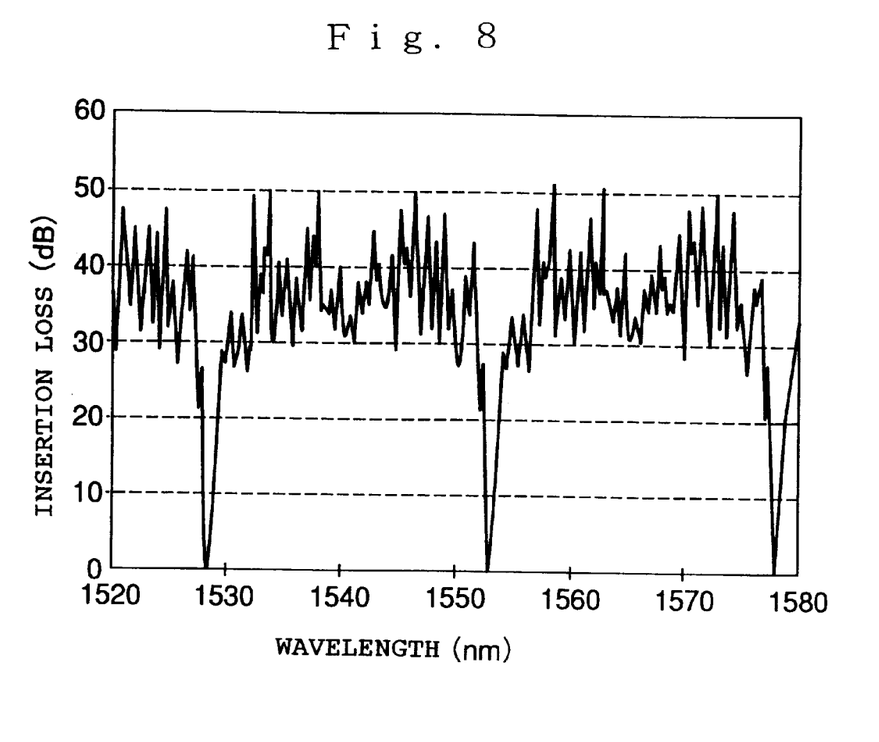
FIG. 8 depicts a graph showing an example of a transmission spectrum of an arrayed waveguide grating fabricated by a method for fabricating an orthodox optical waveguide.

However, the transmission spectrum of the arrayed waveguide grating of 16 channels—100 GHz (having the function of combining/separating 16 lights that have a different wavelength each other at an approximately 0.8 nm spacing in a 1.55 μm band), which was fabricated by the normally fabricating method set forth, is as shown in FIG. 8. According to this drawing, the background crosstalk is estimated at approximately 25 dB. On this account, the normally arrayed waveguide grating has not sufficiently satisfied the crosstalk characteristics that are required to apply to the wavelength division multiplexing transmission systems.

It is known that the factor that degrades the crosstalk of the arrayed waveguide grating is a phase error, which is generated in the channel waveguides of the arrayed waveguide grating. A phase error δφi of the ith channel waveguide is generally expressed by an equation (1).

$$\delta\varphi_i = \int \left\{ \left(\frac{\partial \beta}{\partial t}\right)\delta t_i(z) + \left(\frac{\partial \beta}{\partial w}\right)\delta w_i(z) + \left(\frac{\partial \beta}{\partial n}\right)\delta n_i(z) \right\} dz \quad (1)$$

Where β is a propagation constant, δti(z) is a film thickness variation in the propagating direction of the ith channel waveguide and δni(z) is a variation of a refractive index in the propagating direction of the ith channel waveguide. According to study results in the past, it is known that the variation of the refractive index of the third term of the integration in the right hand side of the equation (1) affects the phase error of the arrayed waveguide grating most. NARA and KASHIHARA, the inventors of the invention, proposed in a Japanese Patent Application (Application No. 226616/1999, filed on Aug. 10, 1999) that the crosstalk should be improved by forming a core that constitutes an arrayed waveguide grating to have a large number of deposition layers.

However, a great number of arrayed waveguide gratings were produced using this proposed fabricating method, yields of the arrayed waveguide gratings that have the background crosstalk of 28 dB or above were comprehended and consequently the yields could not be satisfied sufficiently. It was found that further study would be needed.

One viewpoint of the invention is to provide an optical waveguide such as an arrayed waveguide grating having excellent crosstalk characteristics and a method for fabricating the same.

One method for fabricating the optical waveguide of the invention is a method in which glass particles are deposited on a substrate by a flame hydrolysis deposition method using a burner and an optical waveguide part is formed. The inventors noticed that the density of the glass particles to be deposited was made uniform and they conducted the study of the glass particle density as follows. Initially, the spot distribution of the glass particles jetted out of the burner being in the stationary state was measured. As a result, a measurement result shown in FIG. 6 was obtained. Additionally, the position of a horizontal axis in FIG. 6 is shown as the center position of the spot distribution mentioned above is set 0.

Figure 6:
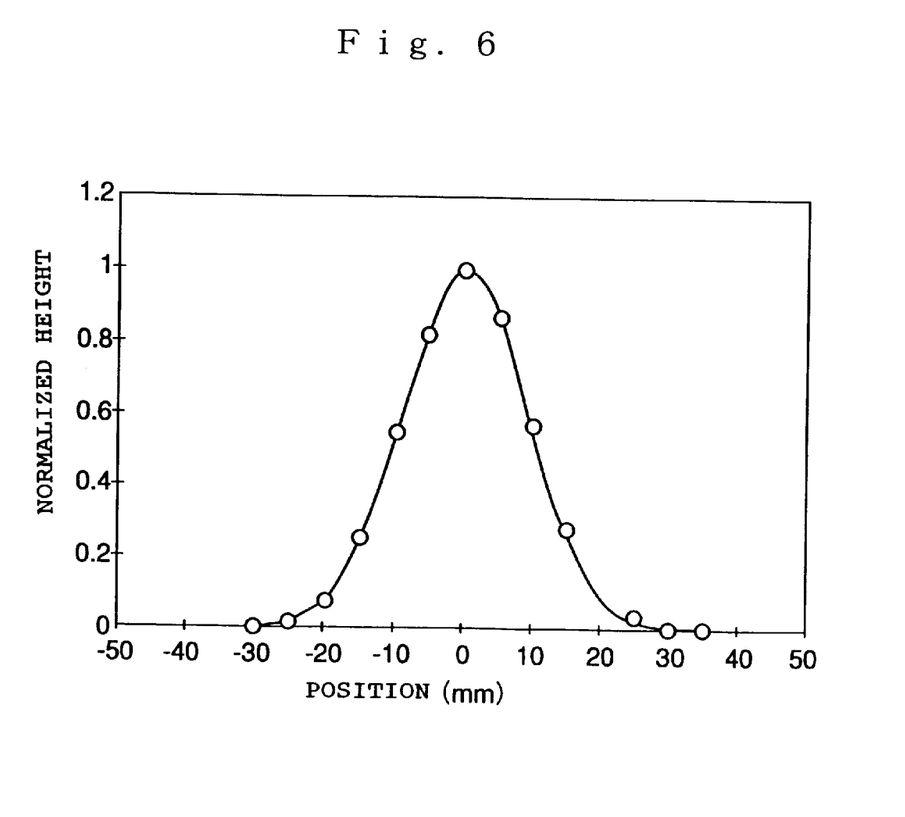
FIG. 6 depicts a graph showing a measurement result of a burner spot distribution when a burner is stationary.

As shown in FIG. 6, the spot distribution of the glass particles jetted out of the burner being in the stationary state is approximately the Gaussian distribution. According to the distribution geometry, a spot radius can be estimated at 12.5 mm. Then, a spot function SP(x) of the burner with respect to a position is expressed by an equation (2), where the maximum height (maximum thickness) of the burner spot is H.

$$SP(x) = H\exp\left(-\frac{x^2}{12.5^2}\right) \quad (2)$$

In the flame hydrolysis deposition method set forth, the burner moves to and fro in the radial direction between the position $r_1$ in the radial direction of the turntable and the position $r_2$ on the side inner than the position $r_1$. Thus, a burner-moving rate at a position r in the radial direction between the positions $r_1$ and $r_2$ is expressed by an equation (3). Furthermore, the substrate is placed at an arbitrary position between the positions $r_1$ and $r_2$ and the glass particles that constitute the optical waveguide part are deposited on this substrate.

$$\frac{dr}{dt} = \frac{v_1 r_1}{r}\{1 + f(r)\} \quad (3)$$

Here, $v_1$ is a burner-moving rate at the position $r_1$ on the turntable. Moreover, f(r) is a burner rate correcting function for correcting an operating error or the like of respective burner devices. Therefore, theoretically f(r)=0.

Then, a burner spot distribution (a spot distribution of the deposited glass particles that are blown out of the burner) at a certain time t becomes a distribution that corresponds to the combined rate of the burner-moving rate with a rotation velocity rω of the turntable, being expressed by an equation (4). Additionally, the greater the combined rate of the burner-moving rate with the rotation speed rω of the turntable becomes (because a relative rate with respect to the turntable is increased), the thinner the glass particles that are blown out of the burner are deposited.

$$SP(x, t) = \frac{H\exp\left(-\frac{x^2}{12.5^2}\right)}{\sqrt{(r\omega)^2 + \left(\frac{dr}{dt}\right)^2}} \quad (4)$$

Figure 7A:
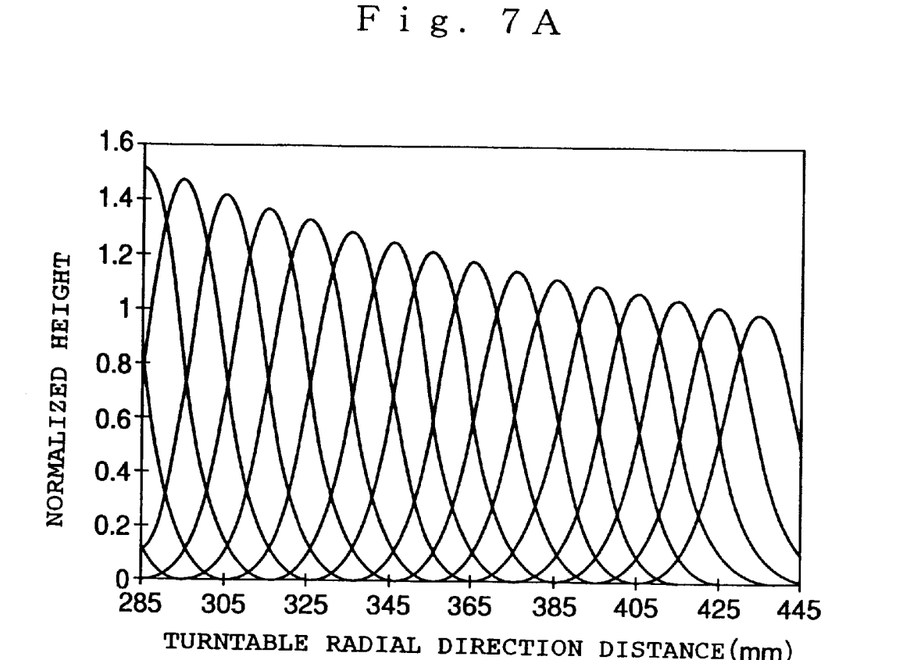
FIGS. 7A and 7B depict graphs showing calculation results of burner spot loci when the burner is reciprocated at a constant rate in the radial direction of the turntable that rotates at a constant angular speed.
Figure 7B:
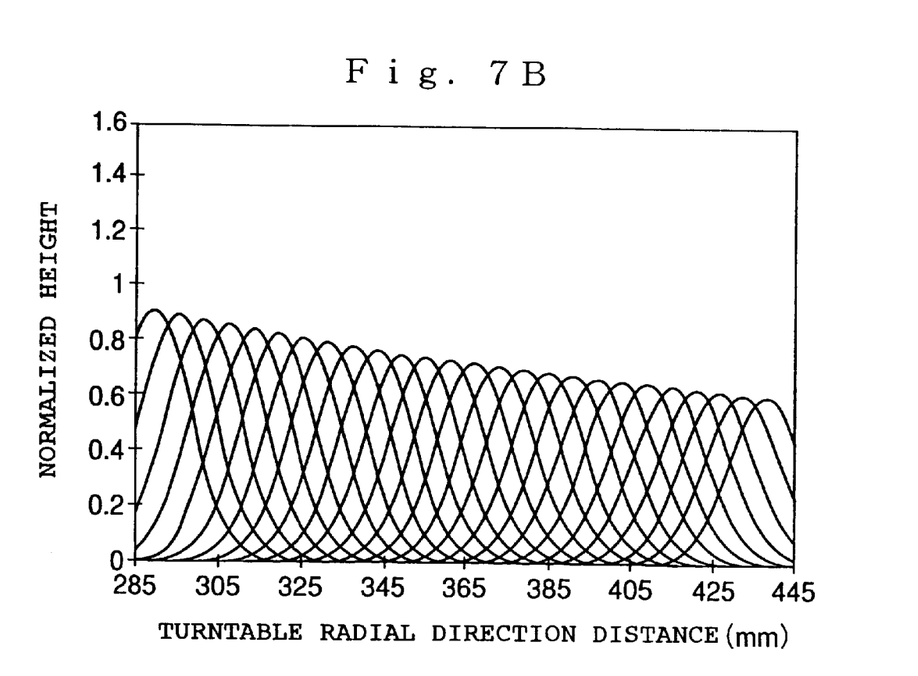

Then, when the loci of the burner spot in one cross section in the radial direction of the turntable were calculated using the equations (2) to (4), the results shown in FIGS. 7A and 7B were obtained; where $r_1$=445 mm, $r_2$=285 mm, $v_1$=1.5 mm/sec and f(r)=0 for simplicity.

Additionally, FIG. 7A shows calculation results when the angular speed of rotation ω of the turntable was set 9.0 rpm; in this case, the rotation velocity at the position $r_1$ becomes 419.403 mm/sec. Furthermore, FIG. 7B shows calculation results when the angular velocity of rotation ω of the turntable was set 15.0 rpm; in this case, the rotation speed at the position $r_1$ becomes 699.004 mm/sec. Besides, in both FIGS. 7A and 7B, the spot maximum height (thickness) H is set 1 at the position $r_1$ in the case of the angular velocity of rotation ω of the turntable =9.0 rpm, expressing a normalized value.

It is apparent from these drawings that there are characteristics [1] and [2]:

[1] one that has a greater rotation speed of the turntable has a smaller burner spot height H; and

[2] one that has a greater rotation speed of the turntable has the larger number of times of the burner passing across a burner operating region (a region between the positions $r_1$ and $r_2$)

Generally, in the spot distribution of the glass particles that are blown out of the burner, glass particles having a low density are generated in the tail of the spot while glass particles having a high density are generated in the center part of the spot. Considering this fact along with the characteristics [1] and [2], because one that has a greater rotation velocity of the turntable has the smaller burner spot height H as described in the characteristic [1], the density dispersion in the spot can be reduced. Furthermore, because the number of times of the burner passing across the region between the positions $r_1$ and $r_2$ becomes greater as mentioned in the characteristic [2], the portion of the glass particles having a low density in the tail of the spot is consolidated by the next flame, forming a film having a uniform density as a whole.

In this manner, when the glass particle film is made uniform, the uniformity of the glass film that is finally obtained by treating the glass particle film at a high temperature is made excellent and the uniformity of the refractive index is improved as well. Therefore, according to the study mentioned above, it was found that the rotation velocity of the turntable is made fast to intend to improve the uniformity of the refractive index and thereby the phase errors of the arrayed waveguide grating can be suppressed to enhance the crosstalk of the arrayed waveguide grating by the equation (1).

Next, in order to specifically find a relationship between the rotation speed of the turntable and the background crosstalk, the arrayed waveguide grating of 16 channels—100 GHz was produced; where $r_1=445$ mm, $r_2=285$ mm and $v_1=1.5$ mm/sec, varying the angular velocity of rotation $\omega$ of the turntable from 9.0 rpm to 25 rpm. Then, the transmission spectrum of this arrayed waveguide grating was measured, the background crosstalk was plotted with respect to a rotation speed $r_1\omega$ at the position $r_1$ in the radial direction of the turntable and consequently the result shown in FIG. 2 was obtained.

Figure 2:
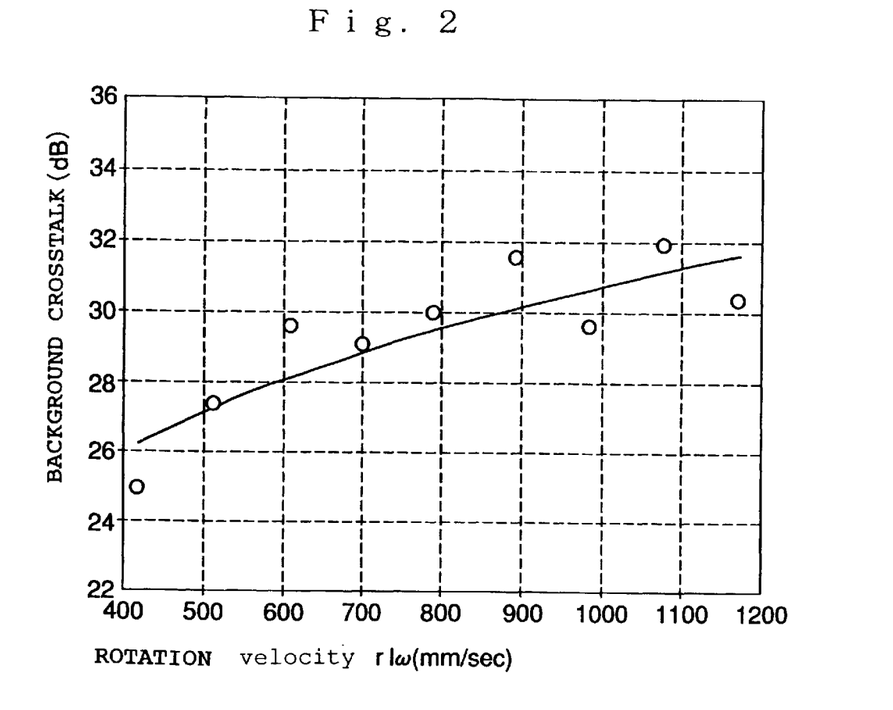
FIG. 2 depicts a graph showing one result according to the fabricating method of the invention, measuring a relationship between a rotation speed $r_1\omega$ at a position $r_1$ in the radial direction of a turntable when producing the optical waveguide and a background crosstalk of a produced arrayed waveguide grating.

It is apparent from FIG. 2 that it was found that the excellent crosstalk characteristics of 28 dB or above are obtained when the rotation speed $r_1\omega$ at the position $r_1$ in the radial direction of the turntable is set 600 mm/sec or above. Additionally, as described above, the burner spot distribution at a certain time t corresponds to the combined rate of the burner-moving rate with the rotation speed $r\omega$ of the turntable. However, when the rotation speed $r\omega$ of the turntable is compared with the burner-moving rate, the rotation speed of the turntable is far greater and therefore the burner-moving rate is considered to have small effect on the burner spot distribution.

One viewpoint of the invention is characterized in that according to the study mentioned above, when fabricating an optical waveguide apparatus by the flame hydrolysis deposition method, the turntable rotation speed $r_1\omega$ at the position $r_1$ is set 600 mm/sec or above at least in the step of depositing the core glass particle among the steps of depositing the under cladding glass particle, the core glass particle and the over cladding particle. Thus, as mentioned above, it is made possible to obtain the optical waveguide such as the arrayed waveguide grating having the excellent crosstalk characteristics.

Hereafter, embodiments of the invention will be described more specifically according to drawings. Additionally, in the description of the embodiments, portions common to those that have been described so far are designated the same signs, omitting or simplifying the overlapping descriptions thereof. A method for fabricating an optical waveguide of one embodiment of the invention is almost the same as the method for fabricating the normally optical waveguide shown in FIGS. 1A to 1E, the method forming the optical waveguide part 10 by sequentially depositing the under cladding glass particle, the core glass particle and the over cladding particle on the substrates 11 as the rotation in the direction B of the turntable 5 and the reciprocating movement in the direction A of the burner 6 are conducted as shown in FIG. 1A. One embodiment of the invention is characterized in that the core glass particle is deposited as the turntable rotation speed $r_1\omega$ at the position $r_1$ in the radial direction of the turntable 5 is set 600 mm/sec or above.

Specifically, in one embodiment, a plurality of substrates 11 are placed at an arbitrary position between the positions $r_1$ and $r_2$ as shown in FIG. 1A, where the position $r_1=445$ mm and the position $r_2=285$ mm on the turntable 5.

Additionally, the diameter of the substrate 11 is set 100 mm$\phi$ as one example. Furthermore, the moving rate $v_1$ of the burner 6 is set $v_1=1.5$ mm/sec as one instant.

Then, the angular speed of rotation $\omega$ of the turntable is set 15.0 rpm in the step of depositing the core glass particle (step of depositing core film), for example. Thereby, the turntable rotation speed $r_1\omega$ at the position $r_1$ in the radial direction of the turntable 5 is set 699.004 mm/sec in the step of depositing the core glass particle.

Additionally, in one embodiment, the angular speed of rotation $\omega$ of the turntable is set 9.0 rpm in the both steps of depositing the under cladding glass particle (step of depositing under cladding film) and the over cladding glass particle (step of depositing over cladding film). The turntable rotation speed $r_1\omega$ at the position $r_1$ in the radial direction of the turntable 5 is set 419.403 mm/sec in these steps.

One embodiment is the fabricating method as set forth and is one where the rotation speed of the turntable 5 in the core glass particle depositing step is set to a distinctive value according to the results of the inventors' study and thus the optical waveguide such as the arrayed waveguide grating having the excellent crosstalk characteristics can be obtained.

Figure 3:
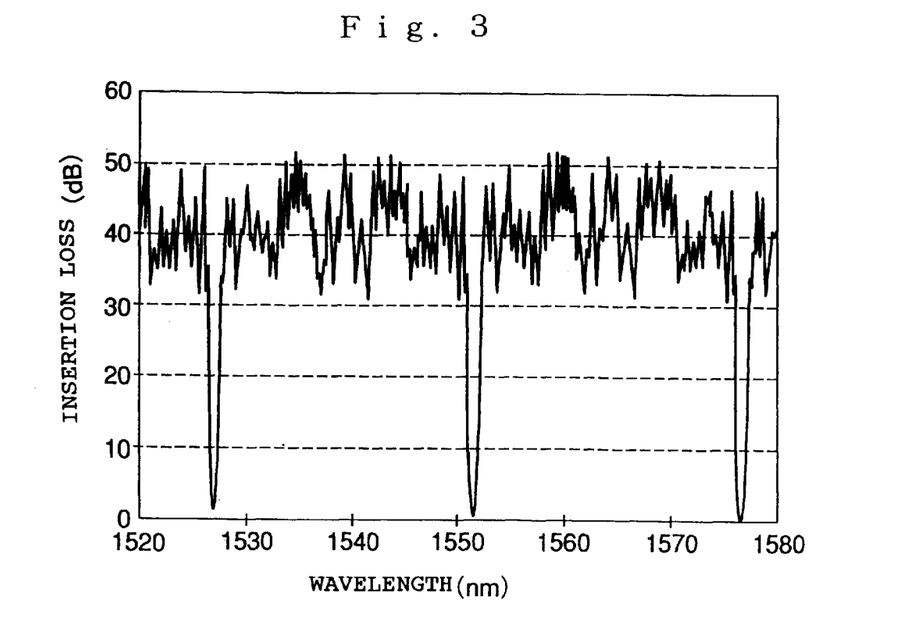
FIG. 3 depicts a graph showing one example of a transmission spectrum of an arrayed waveguide grating fabricated by applying a fabricating method of one embodiment of the invention.

In order to confirm the effectiveness of this embodiment, the inventors fabricated the arrayed waveguide grating of 16 channels—100 GHz using the fabricating method of the embodiment as set forth and measured the transmission spectrum of the arrayed waveguide grating. The measurement result thereof is shown in FIG. 3. It is apparent from FIG. 3 that it was found that this arrayed waveguide grating has the excellent crosstalk characteristics with the background crosstalk of approximately 30 dB.

Additionally, the arrayed waveguide gratings described above were repeatedly fabricated at ten times applying the fabricating method of the embodiment as set forth and the background crosstalk of each of the produced arrayed waveguide gratings was measured. Consequently, the average was about 29.6 dB. Furthermore, 90% or more of the arrayed waveguide gratings has the background crosstalk of 28 dB or above and production yields were dramatically improved.

The invention is not limited to the embodiments described above and can adopt any forms. For example, in the embodiment set forth, the burner 6 was set to reciprocate between the position $r_1$ in the radial direction of the turntable 5 and the position $r_2$ in the same radial direction of the turntable 5, where the position $r_1=445$ mm and the position $r_2=285$ mm. However, the values of the positions $r_1$ and $r_2$ are not limited particularly and can be set arbitrarily. That is, in the method for fabricating the optical waveguide apparatus of the invention, when the value of the position $r_1$ is small, an angular velocity $\omega$ of the turntable 5 is set great and the turntable rotation velocity $r_1\omega$ at the position $r_1$ in the radial direction of the turntable 5 may be set 600 mm/sec or above in the step of depositing the core glass particle.

Additionally, the position $r_2$ mentioned above can be determined arbitrarily corresponding to the position $r_1$, the diameter size of the substrate 11 and others. The positions $r_1$ and $r_2$ set forth and the position of the substrate 11 may be set so as to render the height of the glass particles that are blown out of the burner 6 uniform when the substrate 11 is placed at the arbitrary position between the positions $r_1$ and $r_2$.

Furthermore, in the embodiment described above, the moving rate $v_1$ of the burner 6 was set 1.5 mm/sec. However, as set forth, when the rotation speed $r\omega$ of the turntable is compared with the burner-moving rate, the rotation speed of the turntable is far greater and thus the burner-moving rate is considered to have small effect on the burner spot distribution. Therefore, the moving rate of the burner 6 is not limited particularly and can be set arbitrarily.

However, when the moving rate of the burner 6 is set greater, the combined rate of the burner-moving rate with the rotation velocity $r\omega$ of the turntable becomes greater, the glass particles that are blown out of the burner are deposited thinly and thus the moving rate of the burner 6 is more desirable to be fast.

Furthermore, in the embodiment set forth, the turntable rotation speed $r_1\omega$ at the position $r_1$ in the radial direction of the turntable 5 was set 600 mm/sec or above in the step of depositing the core glass particle among the steps of depositing the under cladding glass particle, the core glass particle and the over cladding particle. However, the turntable rotation velocity $r_1\omega$ at the position $r_1$ may be set 600 mm/sec or above in either or both of these steps of depositing the under cladding glass particle and the core glass particle as well.

Moreover, the description set forth has described the example where the arrayed waveguide grating was fabricated by applying the fabricating method of the embodiment mentioned above. However, an optical waveguide other than the arrayed waveguide grating can be fabricated by applying the method for fabricating the optical waveguide of the invention as described in the embodiment set forth. In this case, the uniformity of the refractive index in the optical waveguide part can also be enhanced and an optical waveguide apparatus having the excellent crosstalk characteristics can be made as shown in the example of the arrayed waveguide grating mentioned above.

As described above, according to the method for fabricating the optical waveguide in the one viewpoint of the invention, based on the above-described study done by the inventors, the turntable rotation speed $r_1\omega$ at the position $r_1$ is set 600 mm/sec or above at least in the step of depositing the core glass particle among the steps of depositing the under cladding glass particle, the core glass particle and the over cladding particle when fabricating the optical waveguide apparatus by the flame hydrolysis deposition method. Thereby, the optical waveguide such as the arrayed waveguide grating having the excellent crosstalk characteristics can be obtained with high yields.

In addition, the optical waveguide in another viewpoint of the invention can be the optical waveguide such as the arrayed waveguide grating having the excellent crosstalk characteristics because it is fabricated by the method for fabricating the optical waveguide set forth.

What is claimed is:

1. A method for fabricating an optical waveguide comprising:

placing one or more of substrates at a circumferential position on a turntable remote from a rotational center position in a radial direction;

rotating the turntable at a constant angular velocity of rotation $\omega$ in this substrate position;

moving a burner to and fro in the radial direction of the turntable between a position $r_1$ in the radial direction of said turntable rotating and a position $r_2$ on the side inner than the position $r_1$ to reciprocate the burner across said substrates;

passing a material gas of glass, an oxygen gas and a hydrogen gas through said burner to generate a hydrolysis reaction of said material gas in a hydrogen oxygen flame; and sequentially depositing an under cladding glass particle, a core glass particle and an over cladding particle on said substrates to form an optical waveguide part, wherein a turntable rotation speed $r_1\omega$ at said position $r_1$ is set 600 mm/sec or above at least in the step of depositing the core glass particle among said steps of depositing the under cladding glass particle, the core glass particle and the over cladding particle.

2. An optical waveguide apparatus fabricated by the method for fabricating the optical waveguide according to claim 1.

3. The optical waveguide according to claim 2 being an arrayed waveguide grating, the arrayed waveguide grating comprising:

one or more of input optical waveguides arranged side by side;

a first slab waveguide connected to an output side of said input optical waveguides;

an arrayed waveguide made of a plurality of channel waveguides arranged side by side, the channel waveguides being connected to an output side of said first slab waveguide and the channel waveguides having a different setting amount each other;

a second slab waveguide connected to an output side of said arrayed waveguide made of the plurality of channel waveguides; and a plurality of output optical waveguides arranged side by side, the output optical waveguides being connected to an output side of said second slab waveguide.

* * * * *